United States Patent [19]

Miller et al.

[11] Patent Number: 4,777,434
[45] Date of Patent: Oct. 11, 1988

[54] MICROELECTRONIC BURN-IN SYSTEM

[75] Inventors: Vernon R. Miller, Atlanta; Lincoln E. Roberts, Decatur, both of Ga.

[73] Assignee: AMP Incorporated, Harrisburg, Pa.

[21] Appl. No.: 23,892

[22] Filed: Mar. 9, 1987

Related U.S. Application Data

[63] Continuation of Ser. No. 783,719, Oct. 3, 1985, abandoned.

[51] Int. Cl.⁴ .................... G01R 1/04; G01R 31/02
[52] U.S. Cl. .................... 324/158 F; 219/209; 324/73 PC
[58] Field of Search ............ 214/200, 201, 209, 504, 214/505; 324/158 P, 158 F, 73 PC; 361/385; 374/45, 57; 340/597

[56] References Cited

U.S. PATENT DOCUMENTS

| | | | |
|---|---|---|---|
| 3,584,189 | 6/1971 | Marcoux | 219/209 |
| 4,256,945 | 3/1981 | Carter et al. | |
| 4,374,317 | 2/1983 | Bradshaw | 219/201 |
| 4,400,613 | 8/1983 | Popelish | 219/216 |
| 4,553,020 | 11/1985 | Val | 219/209 |
| 4,568,277 | 2/1986 | MacInnes et al. | 219/209 |
| 4,607,220 | 8/1986 | Hollmann | 324/158 F |
| 4,683,424 | 7/1987 | Cutright et al. | 324/158 F |
| 4,695,707 | 9/1987 | Young | 324/158 F |

FOREIGN PATENT DOCUMENTS 1076772  3/1964  United Kingdom .

OTHER PUBLICATIONS

"Improved Design of an Electrical Component Test System", by Alewine et al, IBM Tech. Disc., Aug. '83, vol. 26, #3B, p. 1464.
Electronic Packaging & Production (pp. 16, 18).
Electronic Engineering Times (12-2-85).
Electronic Design (11-14-85).

*Primary Examiner*—Reinhard J. Eisenzopf
*Assistant Examiner*—W. Burns
*Attorney, Agent, or Firm*—Robert W. Pitts

[57] ABSTRACT

An apparatus for use in thermally testing electrical components, especially microelectronic components, such as dual in-line integrated circuit packages is disclosed. The apparatus is for use in testing the electrical performance of components when subjected to elevated temperature. Heat is applied through resistive heating elements disposed adjacent the electrical components which are mounted in electrical connectors, such as DIP sockets. Separate test and heater printed circuit boards attachable to conventional edge connectors can be employed. Insulation completely surrounds the sockets and the electrical components. Heating elements having a ferromagnetic-nonferromagnetic layer construction and exhibiting constant temperature regulation at a characteristic Curie point can be employed.

10 Claims, 4 Drawing Sheets

MICROELECTRONIC BURN-IN SYSTEM

This application is a continuation of application Ser. No. 783,719 filed Oct. 3, 1985, now abandoned.

BACKGROUND OF THE INVENTION

1. Field of the Invention

This invention relates to environmental stressing of electrical components and more specifically to thermal or burn-in stressing of microelectronic components including integrated circuit components, such as dual in-line packages (DIP), and associated electrical testing of the components.

2. Description of the Prior Art

Temperature accelerated heat aging to determine the performance of electrical components over their life expectancy is almost universally employed. Not only is such testing used during the development of new products, but many electrical components are subjected to some form of environmental thermal testing prior to shipment. Indeed such thermal cycling is often a part of the manufacturing process. For example, thermal or burn-in procedures are conducted to qualify integrated circuits and integrated circuit components. Conventional techniques for manufacturing integrated circuits do not have a 100% yield. Furthermore, packaging of integrated circuit components also yields a certain percentage of unsatisfactory components. Burn-in testing is one conventional method in which unsatisfactory components are identified.

One common burn-in test standard defines the purpose of such procedures as follows:

"The burn-in test is performed for the purpose of screening or eliminating marginal devices, those with inherent defects or defects resulting from manufacturing aberrations which cause time and stress dependent failures. In the absence of burn-in, these defective devices would be expected to result in infant mortality or early lifetime failure under use conditions. Therefore, it is the intent of this screen to stress microcircuits at or above maximum rated operating conditions or to apply equivalent screening conditions which will reveal time and stress dependent failure modes with equal or greater sensitivity."Mil-Std-883C, Method 1015.5, Aug. 25, 1983.

Conventional burn-in procedures employ relatively large expensive burn-in ovens into which a multitude of microelectronic, microcircuit or integrated circuit components, such as dual in-line packages, are introduced. As the temperature in the oven is elevated, the component is stressed, and the integrated circuit components can be energized by test signals during or after the heating, and their relative performance is monitored to identify unsatisfactory components. Components, such as dual in-line packages (DIP's) can be introduced into the burn-in ovens by first inserting the integrated circuit components into high temperature burn-in sockets. One conventional socket that is suitable for use in burn-in applications for DIPs is the DIPLOMATE HT socket manufactured by AMP Incorporated. DIPLOMATE is a registered trademark of AMP Incorporated. These sockets can be inserted into a printed circuit board and soldered to the board. For burn-in applications, a large number of such sockets are often employed.

When used in conventional burn-in ovens or constant temperature chambers, the integrated circuit components mounted in burn-in sockets soldered to the printed circuit boards are positioned on racks in the burn-in oven. It will be appreciated that such burn-in ovens must be relatively complex, when it is appreciated that precise temperature regulation throughout the high temperature chamber must be controlled even in the presence of the large number of printed circuit board mounted components. Not only must the steady state temperature be precisely controlled, but the heating and cooldown times must be properly regulated.

Conventionally each printed circuit board positioned within the burn-in oven is interconnected to an edge card connector, also located within the high temperature section of the burn-in oven. Edge card connectors normally employed within burn-in ovens must be of the high performance type capable of repeated performance at the test conditions and over the test range in the burn-in oven. These card edge connectors are in turn connected to the exterior of the burn-in oven and to a test signal driving circuit capable of generating signals to operate and evaluate the components to be tested. These driving circuits are in turn driven by electrical power sources located on the exterior of the high temperature chamber, or high temperature section of the burn-in oven. Integrated circuit components mounted within the high temperature section of the burn-in oven are then subjected to an elevated temperature for a specified period. Standard test specifications designating the minimum test time at a given temperature are employed. One example is Mil-Std 883c Method 1015.5. It will be appreciated that such conventional burn-in testing can be a relatively complex and expensive procedure employing not only expensive burn-in equipment but also expensive sockets and connectors for use in high temperature burn-in ovens.

The instant invention constitutes a simple, less costly, alternative which eliminates the need for the high temperature burn-in ovens now employed. The instant invention is not only adaptable to large scale burn-in testing for a large number of components in which automated assembly or robotic assembly is employed to mount the components for burn-in testing, but is also suitable for use in small scale applications such as in development testing of such products.

SUMMARY OF THE INVENTION

The preferred embodiment of this invention is an apparatus for testing electrical components such as microelectronic or integrated circuit components, for example, dual in-line (DIP) packages by heating the components and exciting the components to determine if acceptable levels of performance are obtained from particular components. Conventional burn-in sockets are used to mount the components. These burn-in sockets are secured to a first member such as a printed circuit board by conventional means, such as soldering through-hole leads to conductive traces on the printed circuit board. This first printed circuit board is interconnected to a power source and circuitry is provided for exciting the integrated circuit components mounted in the sockets. A heating element is disposed adjacent the mating surface of each socket and is positioned between the integrated circuit component mounted in the socket and the socket.

In the preferred embodiment of the invention, the heating element is positioned under the circuit component and preferably inside the integrated circuit leads. Resistive heating elements can thus be employed to heat the integrated sockets. In the preferred embodiment of this invention, the resistive heating elements can be mounted on a second printed circuit board, this second printed circuit board being configured such that the heating elements can be disposed adjacent the mating surface of the socket. The sockets are not however attached to the second printed circuit board. The second printed circuit board has conventional conductive traces leading to one edge of the printed circuit board and an interconnection can be made between the second or heater printed circuit board and a conventional edge connector and in turn to the source of electrical power.

Thermal insulation surrounds the integrated circuit components, the burn-in sockets and the heating element, thus confining the heat to the immediate vicinity of the integrated circuit element. Therefore a conventional burn-in oven is not necessary. Furthermore, the entire assembly consisting of a test printed circuit board and a heater printed circuit board with associated sockets and heating elements can be incorporated into a single package, with each printed circuit board being insertable into a conventional edge connector, which need not be subjected to extreme temperatures.

DETAILED DESCRIPTION OF THE PREFERRED EMBODIMENTS

Figure 1:
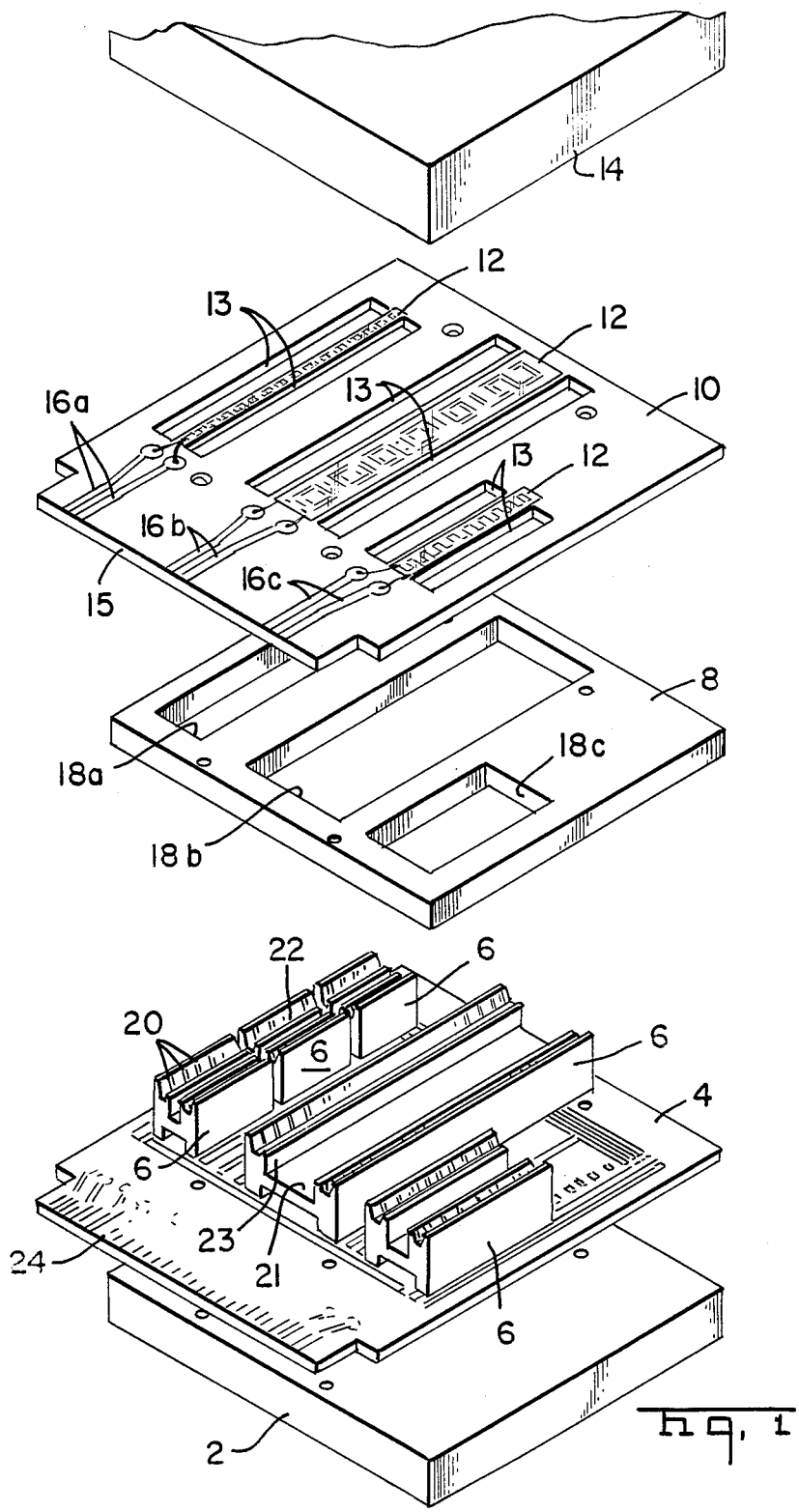
FIG. 1 is an exploded perspective view showing the various elements of the preferred embodiment of this invention.

This invention is described for use with a conventional DIP integrated circuit component, although it should be understood that other components, such as ceramic chip carriers, diodes, transistors, pin grid arrays, flat packs, and hybrid circuits could be tested in a similar manner. A thermal testing apparatus in accordance with the preferred embodiment of this invention includes an insulating base 2 upon which a test printed circuit board 4 can be mounted. A plurality of burn-in sockets 6, such as the DIPLOMATE HT socket manufactured by AMP Incorporated can be soldered to the test circuitry defined by conductive traces on the printed circuit board 4 in a conventional fashion. An insulating spacer 8 configured for positioning on the upper surface of the printed circuit board 4 in surrounding relationship to the burn-in socket 6 is positioned between the test circuit board 4 and an upper heater circuit board 10. Heater circuit board 10 has a plurality of resistive heating elements 12 disposed on the surface thereof. Finally, a thermally insulating cover 14 adapted to fit on the upper surface of heater circuit board 10 provides a means to completely surround the heating elements 12, the burn-in socket 6, and the integrated circuit components to be tested.

Figure 2:
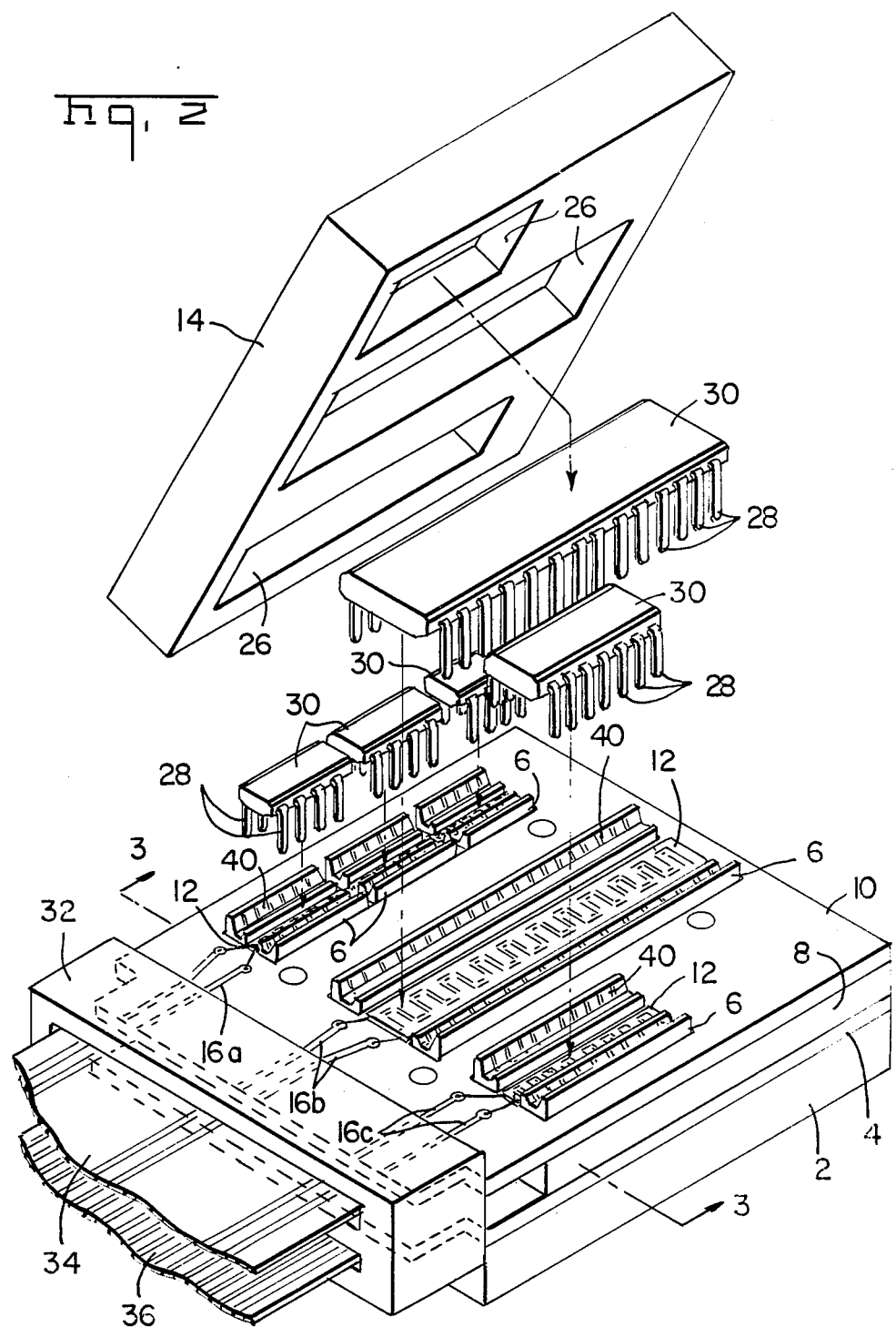
FIG. 2 is a perspective view demonstrating the manner in which the integrated circuit components can be positioned within burn-in sockets.

The preferred embodiment of this invention is intended for use in testing dual in-line integrated circuit components of conventional construction. FIG. 2 shows a plurality of dual in-line integrated circuit packages 30, each having depending leads 28 which can be inserted into the conventional burn-in sockets 6 to make contact with lead contact elements 40 located in rows on opposite sides of the DIP sockets. DIP leads 28 can be vertically inserted into the lead contact elements in the DIP socket to establish a spring contact electrical connection between each of the leads of the DIP socket and circuitry located on the test printed circuit board 4. Although FIG. 2 shows a manner in which a small number of DIPs 30 can be inserted into a small number of corresponding DIP sockets 6, it should be understood that this invention is readily adaptable to testing a large number of DIPs. Indeed an extensive array of DIP sockets 6 each capable of receiving one or a plurality of DIPs 30 could be employed.

Figure 3:
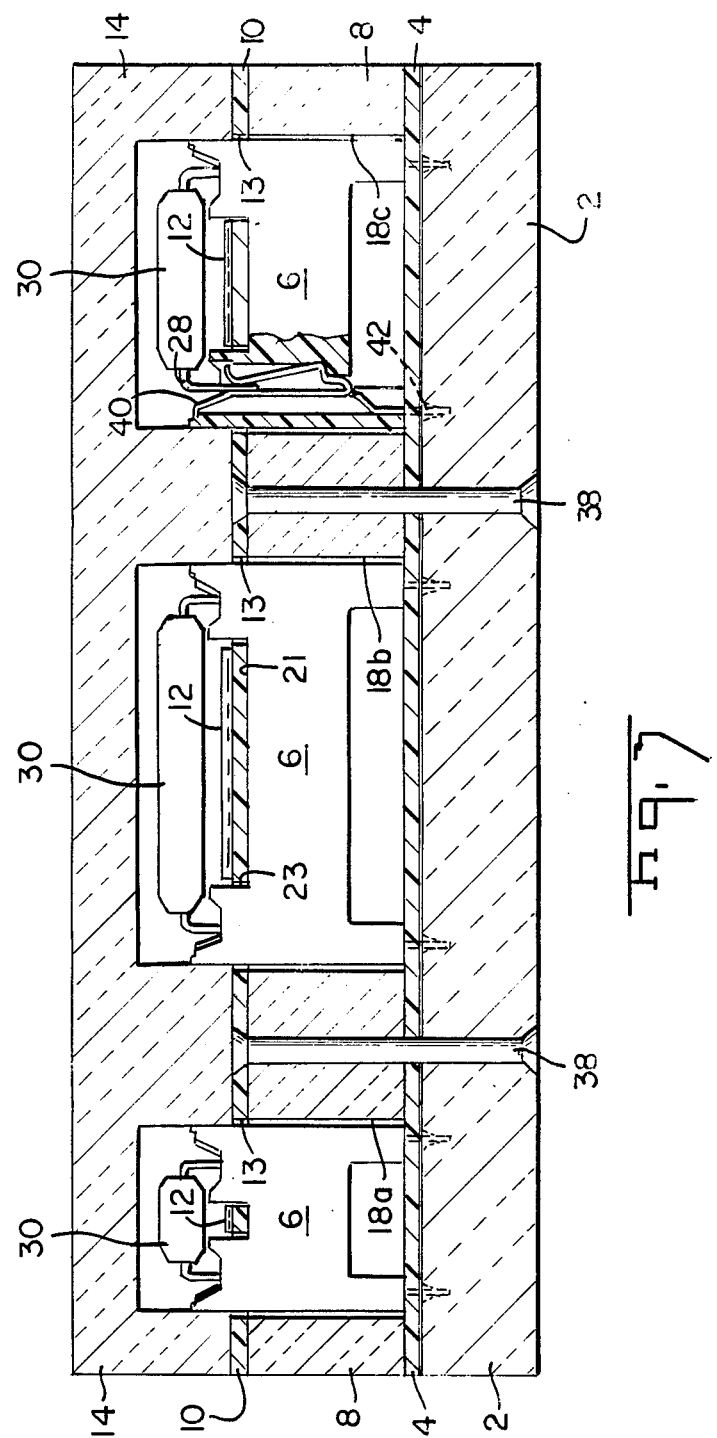
FIG. 3 is a sectional view taken along section line 3—3 demonstrating the position of the integrated circuit components in burn-in sockets and the orientation of the heater and test printed circuit boards surrounded by insulating material.

Although each of the DIP sockets 6 is mounted on the lower test printed circuit board 4, as shown most clearly in FIG. 3, the DIP sockets extend upwardly from the top surface of printed circuit board 4. The upper printed circuit board 10 shown in FIG. 3 can be secured to the heater printed circuit board 4 by conventional means, such as rivets 38. As seen in FIG. 1, the heater printed circuit board 10 has a plurality of elongated openings 13 flanking heating elements 12 and configured in such a manner that the heater printed circuit board 10 can be inserted over and around the DIP sockets 6 attached to printed circuit board 4. Insulating spacer 8, also having openings defined therein for receiving sockets 6, is firmly secured between test printed circuit board 4 and heater printed circuit board 10. In the preferred embodiment of this invention, the base 2, test circuit board 4, spacer 8, sockets 6, and heater printed circuit board 10 all comprise a permanently attached subassembly. Electrical interconnections between the traces comprising the circuitry defined on the test circuit board 4 and the heater element leads 16 defined on the heater circuit board 10 can be made through conventional edge connectors 32 to circuitry on individual conductors or on flat cable 34 and 36 which extends to a power source and/or test equipment. In the preferred embodiment of this invention the traces on both printed circuit boards 4 and 10 lead to one edge of the printed circuit board which extends outwardly beyond the insulation surrounding the sockets 6. In this manner the edge connectors 32 can be thermally isolated from sockets 6, and high performance edge connectors would not be necessary to interconnect the test assembly. Thus the unit assembly comprising printed circuit boards, heater assemblies, insulation, connectors and components can be plugged into room temperature racks that are connected to the power supply circuits and computer driven interrogation circuits. Thus, a small room becomes the burn-in oven but at room temperature. System heat loss can be reduced. All electrical circuits, racks, wires, connectors, and support equipment remains at room temperature, reducing costs. Also if one Burn-In Board should malfunction, it can be replaced or repaired without shutting down an entire oven.

With the socket 6 connected to test circuitry on circuit board 4 and with the heating elements 12 disposed along the mating surface of sockets 6 between rows of lead contact elements, the lower subassembly shown in FIG. 2 can receive DIPs 30 as they are inserted perpendicular to the surface of the upper heater printed circuit board 10. This straight line action is compatible with robotic or automatic handling of the DIPs. Furthermore, the cover 14 can be robotically or automatically inserted following insertion of DIPs 30. Cover 14 might also serve as a carrier for DIPs 30 thus allowing insertion of the cover 14 and DIPs 30 as a subassembly in a single robotic or automatic operation. Once the entire apparatus has been fully assembled, with the DIPs 30 in engagement with corresponding sockets 6, power can be applied to the heating elements 12 and test signals can be applied through circuit board 4 to energize the respective DIP components. Individual DIPs whose performance does not meet accepted standards can then be rejected.

Figure 4:
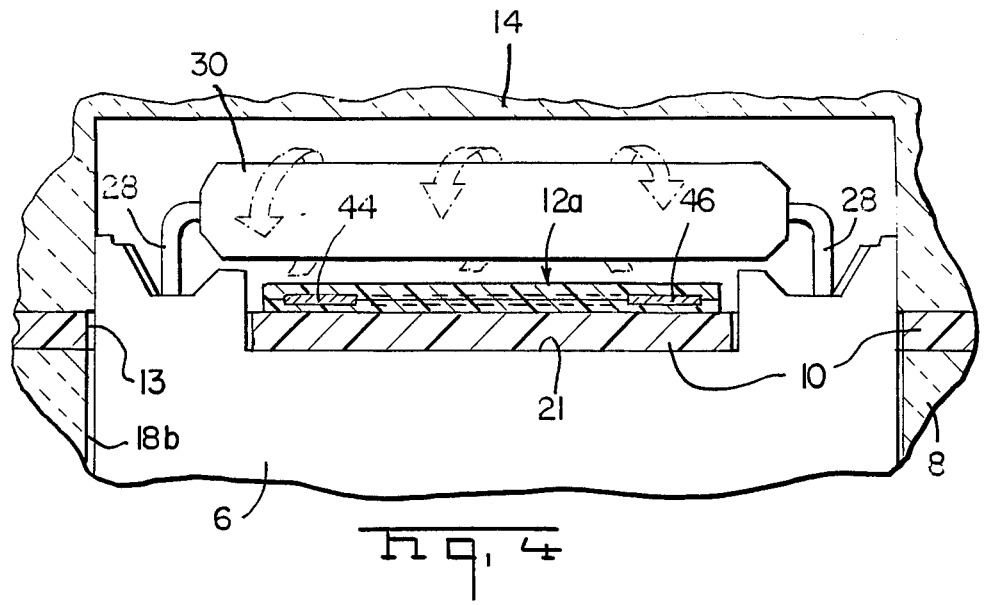
FIG. 4 is a sectional view of a heating element disposed between a mating surface of a socket and an integrated circuit component.
Figure 5:
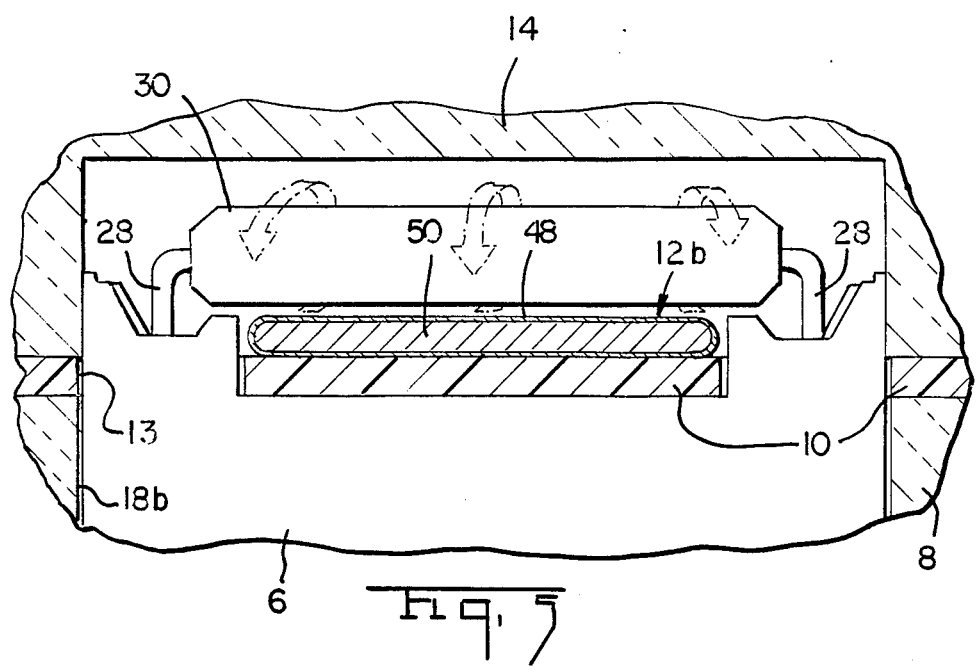
FIG. 5 is a sectional view similar to FIG. 4 showing a different heating element.

FIGS. 4 and 5 illustrate two separate types of heating elements which can be employed in the preferred embodiment of this invention. FIG. 4 shows a resistive heating element ohmically connectable to a source of electrical power disposed between the surface of the socket 6 and the DIP package 30. This resistive heating element 12a can comprise a thermal foil heater and a flexible etched heating elements laminated between insulating layers. Such heating elements are conventionally available and have been used in a number of different applications. When combined with conventional feedback controls and sensors such heating elements can maintain a controlled temperature.

A second type of resistive heating element 12b is shown in FIG. 5. This resistive heating element when electrically coupled to a source of high frequency electrical power has a characteristic operating temperature for a range of applied power and does not require feedback control. The heating element 12b comprises a member having a nonferromagnetic electrically conductive core 50 surrounded by a ferromagnetic outer layer 48. Depending upon the composition of the ferromagnetic outer layer and its extent, this heating element 12b exhibits a characteristic Curie temperature, which can be chosen to be equal to the characteristic operating or test temperature desired for testing DIP 30. When the heating element 12b reaches its Curie temperature, the outer layer 48 changes from a ferromagnetic phase to a paramagnetic phase. A resistive heating element having this ferromagnetic-nonferromagnetic layered construction, when excited by a high frequency electrical power source will exhibit good temperature control. At temperatures below the Curie point electrical conductivity will be essentially confined to the outer ferromagnetic layer due to the electromagnetic skin effect. The skin effect, which results in most of a high frequency current being confined to the exterior of a conductor, is enhanced by the ferromagnetic outer layer 48. Since the outer layer 48 is in general relatively thin, as current is increased, the temperature of the outer layer 48 will increase. At the Curie point the material forming the outer layer will undergo a phase change and become paramagnetic, thus drastically reducing the skin effect and allowing a greater proportion of the current to travel the non-magnetic inner core 50. Thus the heating element will achieve a characteristic temperature at the Curie point of the outer layer. This Curie point can be controlled by changing the composition of the outer layer and by changing its thickness. The principles underlying the operation of this heating element are more fully set forth in U.S. Pat. No. 4,256,945 which is incorporated herein by reference. Resistive heating elements such as element 12b are available from Met-Cal Inc. Use of this type heating element permits temperature regulation at the molecular level over the entire area of the heater element. Thus uniform temperature levels can be maintained even for heater elements having unusual shapes which would be unsuitable for conventional resistance heaters.

It will be appreciated that the testing apparatus depicted herein can achieve precise temperature control and since a smaller volume must be heated, testing can be conducted with the use of less electrical power. Modular construction of this apparatus also permits replacement of the heating element, the sockets, or the test circuitry on the printed circuit board. Finally, this apparatus is easily adaptable to robotic or automatic handling of the components and of the test apparatus itself.

It will be appreciated by those skilled in the art that the invention depicted herein can be incorporated in other structures and is not limited to the preferred embodiment. For example, the heating elements 12 could be disposed on a flexible circuit which could be in turn attached to conductive traces on the lower test printed circuit board. Such assembly would require only one printed circuit board and one edge connector. Furthermore, this invention is not limited to use with the specific socket 6 depicted herein. Other conventional DIP sockets could easily be employed. Indeed this invention is not limited to testing of dual in-line packages since other conventional electrical components could be tested by employing mating connectors in this manner. For example, this apparatus and method are directly adaptable for use with lead-, stud-, or case-mounted devices and to interconnection devices used in the normal mounting configuration for these devices. Therefore, the following claims are in no way limited to the structure disclosed as the preferred embodiment of this invention.

What is claimed is:

1. An apparatus for thermally stressing microelectronic components by thermally exciting the components, and comprising:
    a first circuit panel having test circuitry defined thereon;
    at least one microelectronic component socket interconnected to the test circuitry on the first circuit panel, each socket having a mating face and having component lead contact elements disposed thereon;
    a second circuit panel disposed adjacent the mating face of the socket;
    a heating element disposed externally on the socket on the second circuit panel adjacent the component lead contact elements; and
    thermal insulation surrounding the heating element on the second circuit panel and the sockets and the microelectronic components disposed in the sockets to confine heat from the heating element to the immediate vicinity of the components, whereby the first and second circuit panels can be respectively connected to signal and power sources, and microelectronic components which have been thermally excited by power delivered to the heating element can be tested by electrical signals transmitted through the sockets.

2. The apparatus of claim 1 wherein the socket has two spaced rows of lead contact elements, the heating element being disposed between the two spaced rows.

3. The apparatus of claim 2 wherein the mating face of the socket comprises a channel extending between the two spaced rows, the heating element being disposed in the channel.

4. The apparatus of claim 3 wherein the second circuit panel has a plurality of openings through which the sockets with the spaced rows of contacts extend.

5. The apparatus of claim 1 wherein the thermal insulation is disposed on outwardly facing surfaces of each circuit panel and between the circuit panels.

6. For use in thermally testing microelectronic circuit components mounted in corresponding sockets located in an array and electrically connected to test circuitry, each socket having component lead contact elements disposed thereon; a heating apparatus comprising a circuit board configured for deposition adjacent the lead contact elements between each socket and the corresponding microelectronic component and having heating elements on the circuit board, each heating element being disposable adjacent the lead contact elements, the heating elements being electrically joined to contact traces adjacent one edge of the circuit board for interconnection to a source of electrical power.

7. The apparatus of claim 6 wherein the lead contact elements are aligned in at least one row, the heating apparatus being configured to dispose the heating elements adjacent each row.

8. The apparatus of claim 7 for use in thermally testing dual in-line integrated circuit components.

9. The apparatus of claim 6 further comprising thermal insulation separating the heating elements and the microelectronic components from the one edge of the substrate for interconnection to the source of electrical power.

10. The apparatus of claim 6 wherein the heating elements comprise elements having a nonferromagnetic electrically conductive core and a ferromagnetic outer layer, the heating elements exhibiting a characteristic Curie temperature at which the outer layer changes from a ferromagnetic phase to a paramagnetic phase.

* * * * *